(12) United States Patent
Bai et al.

(10) Patent No.: US 11,296,709 B2
(45) Date of Patent: Apr. 5, 2022

(54) CROSS-CLOCK-DOMAIN PROCESSING CIRCUIT

(71) Applicant: Huawei Technologies Co., Ltd., Shenzhen (CN)

(72) Inventors: Yujing Bai, Shenzhen (CN); Xuhui Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/352,602

(22) Filed: Jun. 21, 2021

(65) Prior Publication Data

US 2021/0313993 A1    Oct. 7, 2021

Related U.S. Application Data

(63) Continuation of application No. PCT/CN2018/122713, filed on Dec. 21, 2018.

(51) Int. Cl.
*H03L 7/081* (2006.01)
*H03L 7/08* (2006.01)
(Continued)

(52) U.S. Cl.
CPC .......... *H03L 7/0814* (2013.01); *H03L 7/0807* (2013.01); *H03L 7/0816* (2013.01); *H03L 7/1806* (2013.01); *H03L 7/24* (2013.01)

(58) Field of Classification Search
None
See application file for complete search history.

(56) References Cited

U.S. PATENT DOCUMENTS

| | | | | |
|---|---|---|---|---|
| 5,414,830 A | * | 5/1995 | Marbot | ..................... G06F 7/76 710/71 |
| 6,459,393 B1 | * | 10/2002 | Nordman | ................ H03M 9/00 341/100 |

(Continued)

FOREIGN PATENT DOCUMENTS

| CN | 101136739 A | 3/2008 |
|---|---|---|
| CN | 101572527 A | 11/2009 |

(Continued)

OTHER PUBLICATIONS

Shu, G., et al., "A Reference-Less Clock and Data Recovery Circuit Using Phase-Rotating Phase-Locked Loop," IEEE Journal of Solid-State Circuits, vol. 49, No. 4, Apr. 2014, 12 pages.

(Continued)

*Primary Examiner* — Adam D Houston
(74) *Attorney, Agent, or Firm* — Conley Rose, P.C.

(57) ABSTRACT

A cross-clock-domain processing circuit configured to implement data processing between asynchronous clock domains with a relatively low latency. The cross-clock-domain processing circuit includes a jitter filtering circuit and a synchronization circuit. The jitter filtering circuit is configured to: perform jitter filtering on a clock recovered from input data; adjust a jitter-filtered clock phase; and output a processed input data clock as an output data clock to the synchronization circuit. The synchronization circuit is configured to perform cross-clock-domain synchronization on the input data based on the input data clock and the output data clock.

20 Claims, 7 Drawing Sheets

(51) Int. Cl.
H03L 7/18 (2006.01)
H03L 7/24 (2006.01)

(56) References Cited

U.S. PATENT DOCUMENTS

| | | | |
|---|---|---|---|
| 7,743,168 B2* | 6/2010 | Tang | H04J 3/047 |
| | | | 709/248 |
| 7,782,932 B2* | 8/2010 | Payne | G01R 31/31715 |
| | | | 375/224 |
| 8,665,928 B1 | 3/2014 | Klein et al. | |
| 10,084,591 B1* | 9/2018 | Palusa | H04L 1/205 |
| 2002/0075981 A1 | 6/2002 | Tang et al. | |
| 2004/0030513 A1* | 2/2004 | Kocaman | H04L 7/0331 |
| | | | 702/79 |
| 2005/0034009 A1 | 2/2005 | Sutardja et al. | |
| 2006/0164266 A1* | 7/2006 | Riedel | H04N 21/242 |
| | | | 341/50 |
| 2007/0038782 A1 | 2/2007 | Jones | |
| 2008/0056426 A1 | 3/2008 | Si et al. | |
| 2009/0147903 A1 | 6/2009 | Kikuchi et al. | |
| 2009/0207957 A1 | 8/2009 | Fukuda et al. | |
| 2010/0097942 A1* | 4/2010 | Cole | H03M 9/00 |
| | | | 370/248 |
| 2011/0022890 A1* | 1/2011 | Jeong | H04L 7/033 |
| | | | 714/15 |
| 2011/0103427 A1* | 5/2011 | Bafra | H03L 7/197 |
| | | | 375/130 |
| 2011/0196997 A1* | 8/2011 | Ruberg | G06F 13/4282 |
| | | | 710/71 |
| 2016/0087764 A1* | 3/2016 | Tsuchiya | H04L 1/243 |
| | | | 375/295 |
| 2017/0139866 A1* | 5/2017 | Wallace | G06F 13/4282 |
| 2018/0054295 A1 | 2/2018 | Ribo et al. | |
| 2018/0156870 A1* | 6/2018 | Kim | G01R 31/31922 |
| 2018/0278461 A1* | 9/2018 | Hollis | G11C 7/1084 |
| 2019/0207742 A1* | 7/2019 | Haroun | H04J 3/06 |
| 2019/0363869 A1* | 11/2019 | Li | H04L 69/24 |
| 2020/0287778 A1* | 9/2020 | Hollis | G11C 11/5628 |
| 2020/0314293 A1* | 10/2020 | Sakai | G06F 3/14 |
| 2021/0313993 A1* | 10/2021 | Bai | H03L 7/0816 |

FOREIGN PATENT DOCUMENTS

| | | |
|---|---|---|
| CN | 103219992 A | 7/2013 |
| CN | 103944583 A | 7/2014 |
| CN | 104038216 A | 9/2014 |
| CN | 104158646 A | 11/2014 |
| CN | 105703767 A | 6/2016 |
| CN | 106849942 A | 6/2017 |
| CN | 107678488 A | 2/2018 |
| EP | 2061177 A1 | 5/2009 |
| WO | 2008029438 A1 | 3/2008 |

OTHER PUBLICATIONS

Miaoyi, Sun, "Design and Implementation of Clock System for Industrial Ethernet Switch," University of Chinese Academy of Sciences (School of Engineering Management and Information Technology, Chinese Academy of Sciences), 2018, Issue 04, 2 pages (abstract).

* cited by examiner

CROSS-CLOCK-DOMAIN PROCESSING CIRCUIT

CROSS-REFERENCE TO RELATED APPLICATION

This application is a continuation of International Patent Application No. PCT/CN2018/122713, filed on Dec. 21, 2018, the disclosure of which is hereby incorporated by reference in its entirety.

TECHNICAL FIELD

This application relates to the field of circuit technologies, and in particular, to a cross-clock-domain processing circuit.

BACKGROUND

As an important high-speed serial link physical layer technology, serializer/deserializer (SerDes) is widely applied to various common input/output (I/O) interfaces such as a Peripheral Component Interface Express (PCIe) interface, an Ethernet interface, and a Serial Advanced Technology Attachment (SATA) interface. When two devices communicate with each other, SerDes is used to convert a multi-bit low-speed parallel data signal into a high-speed serial bitstream at a data transmit end, and re-convert the high-speed serial bitstream into the multi-bit low-speed parallel data signal at a receive end after the high-speed serial bitstream passes through a transmission medium. With development of the high-speed serial link technology, a SerDes rate is increasingly high, but a medium insertion loss (IL) in a high-speed link interconnection medium increases accordingly. Therefore, a retimer needs to be used on a link to increase a drive capability of a signal, such that the high-speed link can allow a larger insertion loss. The retimer is configured to relay a data signal transmitted on the high-speed serial link, for example, reconstruct a signal using an internal clock, to increase transmission energy of the data signal. In addition, the retimer may be further configured to filter out a jitter on a link. This improves data transmission performance.

FIG. 1 shows a retimer 100 in other approaches. Because attenuation of a signal on a high-speed serial link is relatively large and there are many high-frequency jitters on the link, the retimer 100 is usually disposed on the high-speed serial link to relay a data signal and filter out a jitter on the link. The retimer 100 includes a receive end 110, a data processing circuit 120, and a transmit end 130. The receive end 110 is configured to: recover, based on received serial data, a receive clock corresponding to the serial data; convert the serial data into parallel data; and output the parallel data and the receive clock to the data processing circuit 120. The data processing circuit 120 includes a cross-clock-domain processing circuit. The cross-clock-domain processing circuit buffers the parallel data using an elastic buffer and based on the receive clock and a transmit clock that is generated by the transmit end 130, and outputs the buffered parallel data to the transmit end 130. In addition, the data processing circuit 120 is further configured to perform processing such as encoding, decoding, scrambling, and descrambling on the parallel data. The transmit end 130 is configured to convert the parallel data output by the data processing circuit 120 into the serial data, and output the serial data. The elastic buffer is a buffer with a variable data buffer size, and the data buffer size of the elastic buffer is determined based on the receive clock and the transmit clock.

The receive clock is a clock recovered based on the received serial data, and the transmit clock is a clock generated by the transmit end 130, that is, a clock generated based on a reference clock of the retimer 100. Therefore, there is a frequency difference between the receive clock and the transmit clock, and the frequency difference is variable. In this case, the cross-clock-domain processing circuit in the data processing circuit 120 needs to perform asynchronous clock domain processing on the parallel data, such that the parallel data is synchronized from a clock domain of the receive clock to a clock domain of the transmit clock. In addition, the cross-clock-domain processing circuit further needs to process a frequency offset between the receive clock and the transmit clock. In the retimer 100, because the elastic buffer exists in the cross-clock-domain processing circuit according to other approaches, a data processing latency is quite large, and a time in which data passes through the retimer 100 becomes longer. This degrades data processing performance of an entire system. In some transmission protocols, when a clock spread spectrum function needs to be supported, a larger latency is caused when the cross-clock-domain processing circuit performs cross-clock-domain processing on a signal. As a result, the data processing performance of the entire system is further degraded, and especially a latency-sensitive high-speed serial link is affected.

SUMMARY

Embodiments of this application provide a cross-clock-domain processing circuit, to resolve a problem of a relatively high latency caused during cross-clock-domain processing performed on data.

According to a first aspect, an embodiment of this application provides a cross-clock-domain processing circuit configured to perform cross-clock-domain processing on input data. The cross-clock-domain processing circuit includes a jitter filtering circuit and a synchronization circuit. The jitter filtering circuit is configured to perform jitter filtering and phase adjustment on a received input data clock, and output a processed input data clock as an output data clock to the synchronization circuit. A phase of the phase-adjusted output data clock is aligned with a phase of the input data clock. The input data clock is a clock recovered based on the input data. For example, the input data clock is recovered by a clock recovery circuit from the input data. The synchronization circuit is configured to perform cross-clock-domain synchronization on the input data based on the input data clock and the output data clock, to generate synchronization data, that is, synchronize the input data in a clock domain of the input data clock to a clock domain of the output data clock.

Because the cross-clock-domain processing circuit performs jitter filtering and phase adjustment on a clock recovered based on the input data, the cross-clock-domain processing circuit only needs to use the recovered clock to implement cross-clock-domain synchronization of the input data, without using an additional synchronization clock essentially. In this way, hardware resources occupied by an elastic buffer are saved, and a time in which data passes through the cross-clock-domain processing circuit is shorter. This reduces a latency of data processing performed by the cross-clock-domain processing circuit, and improves data transmission efficiency.

In a possible implementation, the jitter filtering circuit includes a frequency divider, a jitter filtering phase-locked loop, and a phase interpolator. The frequency divider is configured to perform frequency division on the input data clock, to obtain a first intermediate clock with a relatively low frequency. The jitter filtering phase-locked loop is configured to sequentially perform jitter filtering and frequency multiplication on the first intermediate clock, to obtain a second intermediate clock whose frequency is equal to that of the input data clock. The phase interpolator is configured to adjust a phase of the second intermediate clock, such that the phase of the second intermediate clock is aligned with the phase of the input data clock, where an adjusted second intermediate clock is the output data clock. Jitter filtering is implemented on the clock by performing the foregoing processing on the input data clock, and the phase of the original input data clock is tracked, such that the clock used for synchronization is generated with fewer hardware resources.

In a possible implementation, the phase interpolator is further configured to: generate a third intermediate clock based on the second intermediate clock, where a phase difference between the second intermediate clock and the third intermediate clock is a preset phase difference; perform phase detection on the three clocks; determine a phase relationship among the three clocks; and adjust phases of the second intermediate clock and the third intermediate clock, such that a phase difference between the input data clock and the second intermediate clock is equal to a phase difference between the third intermediate clock and the input data clock, that is, rising edges of the second intermediate clock and the third intermediate clock are symmetrical with respect to a rising edge of the input data clock. Through the phase adjustment, the phase of the second intermediate clock is aligned with the phase of the input data clock, such that the second intermediate clock can be used to synchronize the input data.

In a possible implementation, the synchronization circuit includes a first synchronization sub-circuit and a second synchronization sub-circuit. The first synchronization sub-circuit is configured to synchronize the input data based on the input data clock, and output a result to the second synchronization sub-circuit. The second synchronization sub-circuit is configured to synchronize the result based on the second intermediate clock, to obtain the synchronization data. Synchronization processing of the input data is implemented using the two synchronization sub-circuits. This simplifies a circuit structure of the cross-clock-domain processing circuit, and reduces a hardware area and power consumption.

In a possible implementation, both the first synchronization sub-circuit and the second synchronization sub-circuit are registers, and the two synchronization sub-circuits synchronize the input data respectively based on the input data clock and the second intermediate clock. The synchronization sub-circuits are implemented using the registers. This greatly reduces circuit complexity of the cross-clock-domain processing circuit, and further reduces the hardware area and the power consumption.

In a possible implementation, the jitter filtering phase-locked loop includes a phase frequency detector, a loop filter, a voltage-controlled oscillator, a feedback frequency divider, and a high-speed frequency divider. The phase frequency detector is configured to: receive the first intermediate clock and a feedback clock; perform frequency and phase detection on the two clocks; and output a comparison result of the frequency and phase detection. The loop filter is configured to filter out a jitter in the comparison result, and output a jitter-filtered comparison result. The voltage-controlled oscillator is configured to generate, based on the jitter-filtered comparison result, a fourth intermediate clock whose frequency is higher than that of the first intermediate clock. The feedback frequency divider is configured to perform frequency division on the fourth intermediate clock to obtain a clock whose frequency is equal to the frequency of the first intermediate clock, and feed back a result obtained after the frequency division to the phase frequency detector. The high-speed frequency divider is configured to perform frequency division on the fourth intermediate clock, and use a frequency-divided fourth intermediate clock as the second intermediate clock. Jitter filtering is implemented on the first intermediate clock using a feedback loop structure in the jitter filtering phase-locked loop, such that clock quality of the second intermediate clock used for synchronization is enhanced.

In a possible implementation, the jitter filtering phase-locked loop further includes a charge pump. An input end of the charge pump is coupled to an output end of the phase frequency detector. The charge pump is configured to convert the frequency and phase comparison result generated by the phase frequency detector into a stable analog conversion voltage, and output the analog conversion voltage to the voltage-controlled oscillator.

In a possible implementation, the cross-clock-domain processing circuit further includes a clock recovery circuit. The clock recovery circuit is configured to recover the received input data based on a working clock of the cross-clock-domain processing circuit to obtain the input data clock, and output the input data and the input data clock. Clock recovery is performed by the clock recovery circuit on the input data, such that the recovered clock can be used to synchronize the input data again after undergoing processing such as jitter filtering, to implement cross-clock-domain processing.

In a possible implementation, the input data is serial data, and the cross-clock-domain processing circuit further includes a serial-to-parallel conversion circuit. The serial-to-parallel conversion circuit is configured to perform serial-to-parallel conversion on the input data, and output input data obtained after the serial-to-parallel conversion (that is, parallel input data) to the synchronization circuit and the jitter filtering circuit. Correspondingly, data between the two synchronization sub-circuits in the synchronization circuit is also parallel data. When the cross-clock-domain processing circuit is configured to process parallel data, data synchronization efficiency can be improved.

In a possible implementation, the jitter filtering circuit is further configured to perform high-frequency jitter filtering on the input data clock, where both the input data clock and the output data clock include spread spectrum clock (SSC) information. Correspondingly, the loop filter in the jitter filtering phase-locked loop is further configured to perform high-frequency jitter filtering on the comparison result output by the phase frequency detector. When the jitter filtering circuit performs high-frequency jitter filtering on the input data clock, a low-frequency jitter carried by the clock may be retained, and is output to a downstream device along with the synchronization data, such that the cross-clock-domain processing circuit can support a specific protocol or a preset function on a transmission link, for example, enabling and disabling a Separate Reference Clock with Independent Spread (SRIS) function.

In a possible implementation, a high-frequency jitter includes a jitter with a jitter frequency higher than 0.005 f, where f is a frequency of a clock. High-frequency jitter filtering is used for filtering out the high-frequency jitter. When the jitter filtering circuit performs high-frequency jitter filtering on the input data clock, a low-frequency jitter carried by the clock may be retained, and is output to a downstream device along with the synchronization data, such that the cross-clock-domain processing circuit can support a specific protocol or a preset function on a transmission link, for example, enabling and disabling an SRIS function.

In a possible implementation, a transmit end sends the input data to the cross-clock-domain processing circuit, and outputs the synchronization data to a receive end. There are the following three cases: 1. The transmit end and the cross-clock-domain processing circuit share one reference clock, and a working clock of the receive end is independent of the shared reference clock. 2. The receive end and the cross-clock-domain processing circuit share one reference clock, and a reference clock of the transmit end is independent of the shared reference clock. 3. The transmit end, the receive end, and the cross-clock-domain processing circuit share one reference clock. The transmit end and the receive end may be devices, may be circuits or function modules or units included in a circuit, or may be interfaces. A reference clock of the cross-clock-domain processing circuit may be independent of reference clocks of the receive end and the transmit end; or the cross-clock-domain processing circuit may share a reference clock with the receive end and the transmit end, such that a clock configuration of the cross-clock-domain processing circuit is more flexible.

According to a second aspect, an embodiment of this application provides a retimer, configured to relay N channels of input data on a transmission link. The retimer includes a jitter filtering circuit and N synchronization circuits (where N≥1, and N is a positive integer). The jitter filtering circuit is configured to perform jitter filtering and phase adjustment on a received input data clock, and output a processed input data clock as an output data clock to the synchronization circuit. A phase of the phase-adjusted output data clock is aligned with a phase of the input data clock. The input data clock is any one of N recovered data clocks recovered by a clock recovery circuit based on the N channels of input data. For example, the N recovered data clocks are recovered by the clock recovery circuit from the N channels of input data, and one recovered clock is selected from the N recovered data clocks, as the input data clock. Each synchronization circuit is configured to perform cross-clock-domain synchronization on input data based on the input data clock and the output data clock, to generate one channel of synchronization data, that is, synchronize the input data in a clock domain of the input data clock to a clock domain of the output data clock.

Because the retimer performs jitter filtering and phase adjustment on a clock recovered based on the N channels of input data, a cross-clock-domain processing circuit only needs to use the recovered clock to implement cross-clock-domain synchronization of the input data, without using an additional synchronization clock essentially. In this way, hardware resources occupied by an elastic buffer are saved, and a time in which data passes through the retimer is shorter. This reduces a latency of data processing performed by the retimer, and improves data transmission efficiency.

In a possible implementation, the jitter filtering circuit includes a frequency divider, a jitter filtering phase-locked loop, and a phase interpolator. The frequency divider is configured to perform frequency division on the input data clock, to obtain a first intermediate clock with a relatively low frequency. The jitter filtering phase-locked loop is configured to sequentially perform jitter filtering and frequency multiplication on the first intermediate clock, to obtain a second intermediate clock whose frequency is equal to that of the input data clock. The phase interpolator is configured to adjust a phase of the second intermediate clock, such that the phase of the second intermediate clock is aligned with the phase of the input data clock, where an adjusted second intermediate clock is the output data clock. Jitter filtering is implemented on the clock by performing the foregoing processing on the input data clock, and the phase of the original input data clock is tracked, such that the clock used for synchronization is generated with fewer hardware resources.

In a possible implementation, the phase interpolator is further configured to: generate a third intermediate clock based on the second intermediate clock, where a phase difference between the second intermediate clock and the third intermediate clock is a preset phase difference; perform phase detection on the three clocks; determine a phase relationship among the three clocks; and adjust phases of the second intermediate clock and the third intermediate clock, such that a phase difference between the input data clock and the second intermediate clock is equal to a phase difference between the third intermediate clock and the input data clock, that is, rising edges of the second intermediate clock and the third intermediate clock are symmetrical with respect to a rising edge of the input data clock. Through the phase adjustment, the phase of the second intermediate clock is aligned with the phase of the input data clock, such that the second intermediate clock can be used to synchronize the input data.

In a possible implementation, each of the N synchronization circuits includes a first synchronization sub-circuit and a second synchronization sub-circuit. The first synchronization sub-circuit is configured to synchronize one of the N channels of input data based on the input data clock, and output a result to the second synchronization sub-circuit. The second synchronization sub-circuit is configured to synchronize the result based on the second intermediate clock, to obtain one channel of synchronization data in the synchronization data. Synchronization processing of the input data is implemented using the two synchronization sub-circuits. This simplifies a circuit structure of the retimer, and reduces a hardware area and power consumption.

In a possible implementation, both the first synchronization sub-circuit and the second synchronization sub-circuit are registers, and the two synchronization sub-circuits synchronize the input data respectively based on the input data clock and the second intermediate clock. The synchronization sub-circuits are implemented using the registers. This greatly reduces circuit complexity of the retimer, and further reduces the hardware area and the power consumption.

In a possible implementation, the jitter filtering phase-locked loop includes a phase frequency detector, a loop filter, a voltage-controlled oscillator, a feedback frequency divider, and a high-speed frequency divider. The phase frequency detector is configured to: receive the first intermediate clock and a feedback clock; perform frequency and phase detection on the two clocks; and output a comparison result of the frequency and phase detection. The loop filter is configured to filter out a jitter in the comparison result, and output a jitter-filtered comparison result. The voltage-controlled oscillator is configured to generate, based on the jitter-filtered comparison result, a fourth intermediate clock whose frequency is higher than that of the first intermediate clock. The feedback frequency divider is configured to perform frequency division on the fourth intermediate clock to obtain a clock whose frequency is equal to the frequency of the first intermediate clock, and feed back a result obtained after the frequency division to the phase frequency detector. The high-speed frequency divider is configured to perform frequency division on the fourth intermediate clock, and use a frequency-divided fourth intermediate clock as the second intermediate clock. Jitter filtering is implemented on the first intermediate clock using a feedback loop structure in the jitter filtering phase-locked loop, such that clock quality of the second intermediate clock used for synchronization is enhanced.

In a possible implementation, the jitter filtering phase-locked loop further includes a charge pump. An input end of the charge pump is coupled to an output end of the phase frequency detector. The charge pump is configured to convert the frequency and phase comparison result generated by the phase frequency detector into a stable analog conversion voltage, and output the analog conversion voltage to the voltage-controlled oscillator.

In a possible implementation, the retimer further includes N clock recovery circuits. The N clock recovery circuits are configured to respectively recover the received input data based on a working clock of the retimer to obtain the N recovered data clocks, and output the input data and the N recovered data clocks. Clock recovery is performed by the clock recovery circuit on the input data, such that the recovered clock can be used to synchronize the input data again after undergoing processing such as jitter filtering, to implement cross-clock-domain processing.

In a possible implementation, the retimer further includes N serial-to-parallel conversion circuits, and the N channels of input data are N channels of serial data. The N serial-to-parallel conversion circuits are configured to respectively perform serial-to-parallel conversion on the N channels of input data, and output a converted result (that is, N channels of parallel data) to the N synchronization circuits and the jitter filtering circuit. High-speed serial data on the transmission link can be converted into parallel data by performing serial-to-parallel conversion on data. This improves efficiency of data processing performed by the retimer, and reduces a data processing time.

In a possible implementation, the retimer further includes N parallel-to-serial conversion circuits, and the N channels of synchronization data are N channels of parallel data. The N parallel-to-serial conversion circuits are configured to respectively perform parallel-to-serial conversion on the N channels of synchronization data, and output a converted result. Processed (synchronized) data can be re-converted into a high-speed serial signal by performing parallel-to-serial conversion on data. This improves efficiency of data processing performed by the retimer, and reduces a data processing time.

In a possible implementation, the retimer further includes N data processing circuits and N data selectors. Input ends of the N data processing circuits are respectively coupled to output ends of the N clock recovery circuits, output ends of the N data processing circuits are respectively coupled to input ends of the N data selectors, and the N data processing circuits are configured to decode, descramble, synchronize, scramble, and encode the received N channels of input data respectively. For one data processing circuit, one clock recovery circuit, and one data selector that are coupled to each other, two input ends of the data selector are respectively coupled to an output end of the clock recovery circuit and an output end of the data processing circuit, and an output end of the data selector is coupled to an output end of the synchronization circuit. An additional control signal may be used to control the data selector to select, as an output, one of two channels of data signals received from the two input ends. In the retimer, the data selector may directly perform cross-clock-domain synchronization on data. Alternatively, the data processing circuit may first process data, and then the data selector may perform cross-clock-domain synchronization on processed data. In this way, a manner of processing input data by the retimer is more flexible. Whether to bypass data can be determined based on different transmission protocols, thereby improving data relay efficiency.

In a possible implementation, the jitter filtering circuit is further configured to perform high-frequency jitter filtering on the input data clock, where both the input data clock and the output data clock include SSC information. Correspondingly, the loop filter in the jitter filtering phase-locked loop is further configured to perform high-frequency jitter filtering on the comparison result output by the phase frequency detector. When the jitter filtering circuit performs high-frequency jitter filtering on the input data clock, a low-frequency jitter carried by the clock may be retained, and is output to a downstream device along with the synchronization data, such that the cross-clock-domain processing circuit can support a specific protocol or a preset function on the transmission link, for example, enabling and disabling an SRIS function.

In a possible implementation, a high-frequency jitter includes a jitter with a jitter frequency higher than 0.005 f, where f is a frequency of a clock. High-frequency jitter filtering is used for filtering out the high-frequency jitter. When the jitter filtering circuit performs high-frequency jitter filtering on the input data clock, a low-frequency jitter carried by the clock may be retained, and is output to a downstream device along with the synchronization data, such that the cross-clock-domain processing circuit can support a specific protocol or a preset function on the transmission link, for example, enabling and disabling an SRIS function.

In a possible implementation, a transmit end sends the input data to the cross-clock-domain processing circuit, and outputs the synchronization data to a receive end. There are the following three cases: 1. The transmit end and the cross-clock-domain processing circuit share one reference clock, and a working clock of the receive end is independent of the shared reference clock. 2. The receive end and the cross-clock-domain processing circuit share one reference clock, and a reference clock of the transmit end is independent of the shared reference clock. 3. The transmit end, the receive end, and the cross-clock-domain processing circuit share one reference clock. The transmit end and the receive end may be devices, may be circuits or function modules or units included in a circuit, or may be interfaces. A reference clock of the cross-clock-domain processing circuit may be independent of reference clocks of the receive end and the transmit end; or the cross-clock-domain processing circuit may share a reference clock with the receive end and the transmit end, such that a clock configuration of the cross-clock-domain processing circuit is more flexible.

In a possible implementation, the retimer is a multi-channel retimer, where N≥2, and N is a positive integer. By increasing quantities of circuits such as quantities of synchronization circuits and clock recovery circuits in the retimer, the retimer can simultaneously process a plurality of channels of input data, thereby further improving data relay efficiency of the retimer.

BRIEF DESCRIPTION OF DRAWINGS

To describe the technical solutions in the embodiments of this application or in other approaches more clearly, the following briefly describes the accompanying drawings used in describing the embodiments or other approaches.

Figure 1:
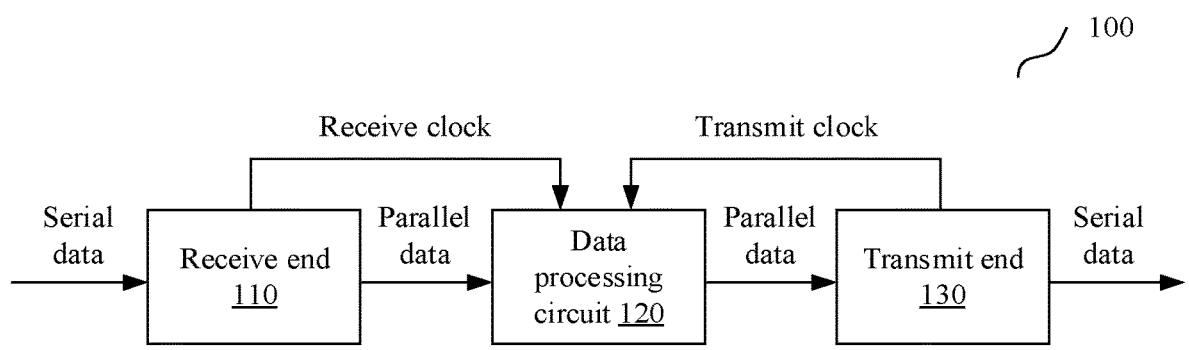
FIG. 1 shows a retimer in other approaches.

Reference numerals: 300: retimer; 310: data receiving circuit; 312: clock recovery circuit; 314: serial-to-parallel conversion circuit; 316: equalizer; 318: first clock circuit; 320: data transmitting circuit; 330: jitter filtering circuit; 340: synchronization circuit; 350: data processing circuit; 360: data selector; and 370: parallel-to-serial conversion circuit.

DESCRIPTION OF EMBODIMENTS

The following clearly and completely describes the technical solutions in the embodiments of this application with reference to the accompanying drawings in the embodiments of this application.

Figure 2:
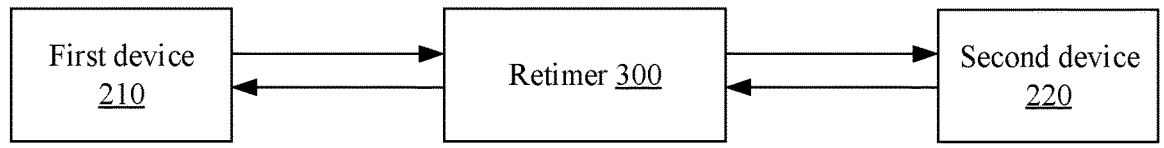
FIG. 2 shows a retimer according to an embodiment of this application.

To resolve a problem that a latency of a retimer is relatively large, an embodiment of this application provides a retimer 300 shown in FIG. 2. The retimer 300 is disposed on a high-speed serial communication link between a first device 210 and a second device 220. The communication link may be a communication link using a protocol, such as a Peripheral Component Interconnect Express (PCIe) protocol, an Ethernet protocol, a Serial Advanced Technology Attachment (SATA) protocol, a Serial Attached Small Computer System Interface (SCSI) (SAS) protocol, or a Universal Serial Bus (USB) protocol. The retimer 300 is configured to relay a data signal, for example, reconstruct a signal using an internal clock, to increase transmission energy of the data signal. The retimer 300 may be further configured to filter out a jitter on the communication link. The data signal may be a data signal sent by the first device 210 to the second device 220, or may be a data signal sent by the second device 220 to the first device 210. The first device and the second device may include a terminal device such as a mobile phone or a tablet computer; may include a server device or a communication base station; or may include a circuit disposed on two independent Printed Circuit Board (PCBs).

Figure 3:
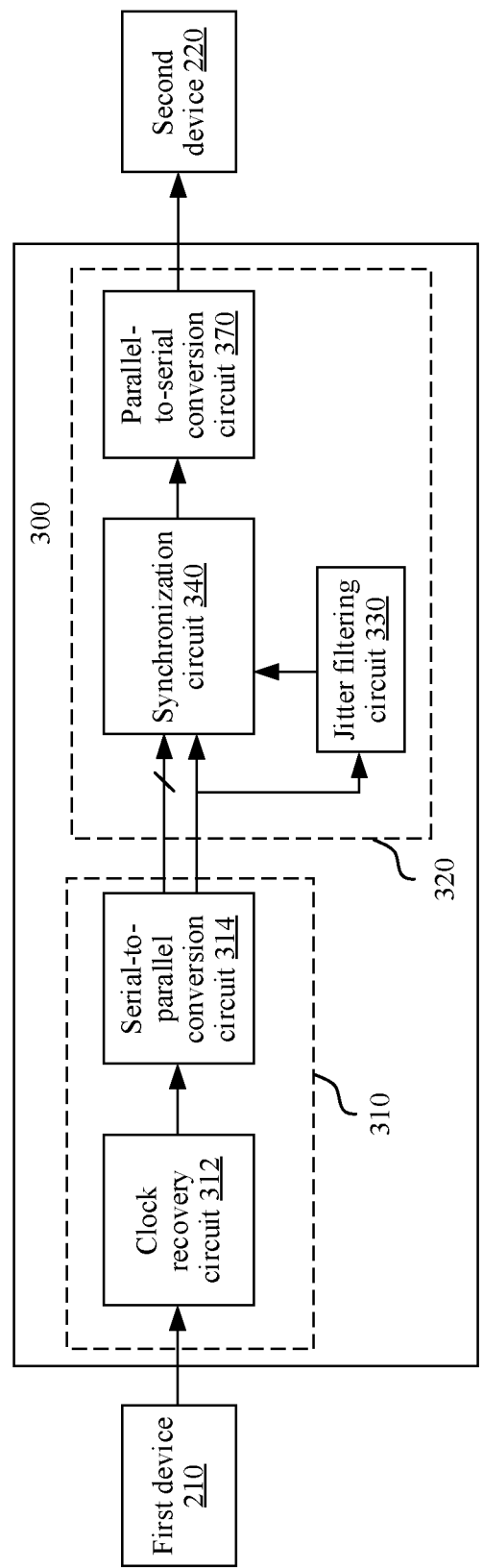
FIG. 3 shows a retimer according to an embodiment of this application

FIG. 3 shows an implementation of the retimer 300. The retimer 300 includes a receiving circuit 310 and a transmitting circuit 320. The receiving circuit 310 includes a clock recovery circuit 312 and a serial-to-parallel conversion circuit 314. The clock recovery circuit 312 is configured to recover a clock in received serial data based on a working clock of the receiving circuit 310 to obtain an input data clock, and output the serial data and the recovered input data clock. The serial-to-parallel conversion circuit 314 is configured to convert the serial data into parallel data and output the parallel data. The working clock of the receiving circuit 310 may be determined based on a reference clock of the retimer 300. The clock recovery circuit 312 may implement clock recovery by detecting a phase of the serial data. The clock recovery circuit 312 may be implemented in a plurality of manners, for example, implemented using a passive filter and a limiting amplifier, implemented using a narrow-frequency regenerative frequency divider, implemented using a synchronous oscillator, or implemented using a phase-locked loop.

The transmitting circuit 320 is configured to: perform cross-clock-domain synchronization on the parallel data output by the receiving circuit 310; convert synchronized parallel data into serial data; and output the serial data to the second device 220. In an embodiment, the transmitting circuit 320 includes a jitter filtering circuit 330, a synchronization circuit 340, and a parallel-to-serial conversion circuit 370. The jitter filtering circuit 330 is configured to: receive the input data clock output by the clock recovery circuit 312; perform jitter filtering on the input data clock; adjust a phase of a jitter-filtered input data clock; and generate an output data clock, such that a phase of the output data clock is aligned with the phase of the input data clock. In an implementation, jitter filtering performed by the jitter filtering circuit 330 on the input data clock may be high-frequency jitter filtering. In this case, after the jitter filtering circuit 330 performs jitter filtering on the input data clock, a jitter of a high-frequency component of the input data clock is filtered out, and a jitter of a low-frequency component of the input data clock is retained. In addition, the low-frequency component may carry useful clock information. The synchronization circuit 340 is configured to perform, based on the input data clock and the output data clock, cross-clock-domain synchronization on the parallel data generated by the clock recovery circuit 312, and generate synchronization data, where the synchronization data is in a clock domain of the output data clock. Because the data in the receiving circuit 310 is in a clock domain of the input data clock, and the data in the transmitting circuit 320 is in the clock domain of the output data clock, the synchronization circuit 340 synchronizes the parallel data from the clock domain of the input data clock to the clock domain of the output data clock. The parallel-to-serial conversion circuit 370 is configured to convert the received synchronization data into serial output data, and output the serial output data to the second device 220. The jitter of the high-frequency component includes a high-frequency jitter generated on the high-speed serial communication link and a high-frequency jitter that is generated by the clock recovery circuit 312 when the clock recovery circuit 312 performs clock recovery.

It should be noted that "high-frequency" in "high-frequency jitter" and "high-frequency jitter filtering" should be a concept well known by a person skilled in the art. For example, all jitters with frequencies higher than 0.005 f carried in a clock whose frequency is f should be considered as high-frequency jitters. Correspondingly, high-frequency jitter filtering means filtering out the jitters with the frequencies higher than 0.005 f. In an embodiment, the jitter filtering circuit 330 provided in this embodiment of this application may perform high-frequency jitter filtering on a 100 megahertz (MHz) clock, and in this case, jitters with frequencies higher than 500 kilohertz (kHz) carried in the clock are all filtered out. Correspondingly, low-frequency jitters are jitters with frequencies lower than 0.005 f. In addition, phase alignment in this application can mean that a phase difference between rising edges of two clocks is a fixed value, for example, the phase difference is maintained at −30°, 0°, or 30°.

Because the retimer 300 performs jitter filtering and phase adjustment on a clock recovered based on the input data, and performs cross-clock-domain synchronization on the input data using the clock, the retimer 300 performs, when relaying data, cross-clock-domain synchronization without using an elastic buffer. In this way, a time in which data passes through the retimer 300 is shorter. This reduces a latency of data processing performed by the retimer 300, especially a latency caused when cross-clock-domain processing is performed on the data, and improves data transmission efficiency.

Figure 4:
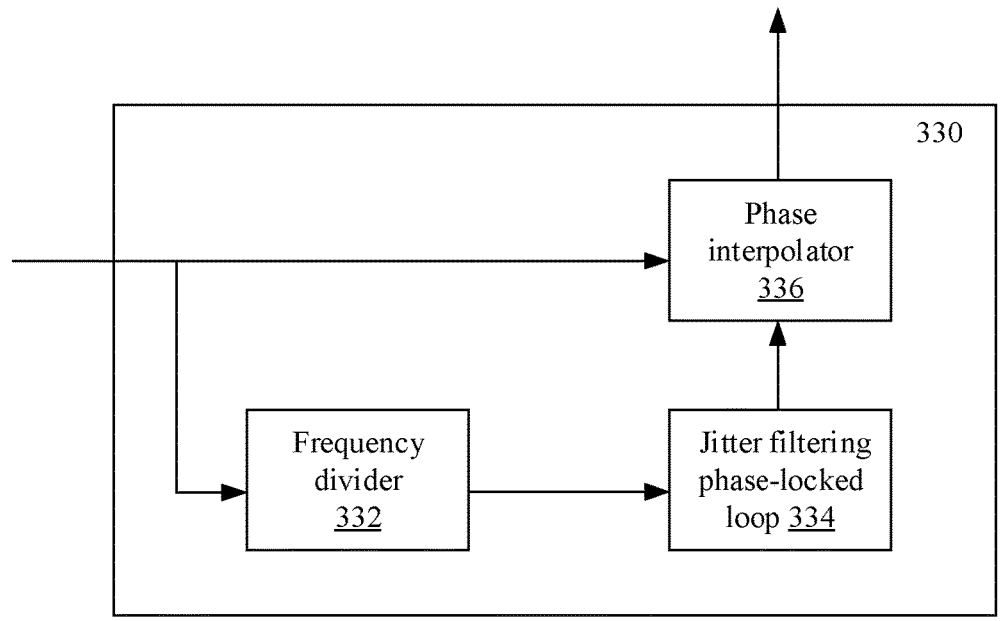
FIG. 4 shows a jitter filtering circuit according to an embodiment of this application.

FIG. 4 shows an implementation of the jitter filtering circuit 330. The jitter filtering circuit 330 includes a frequency divider (DIV) 332, a jitter filtering phase-locked loop 334, and a phase interpolator (PI) 336. The frequency divider 332 is configured to perform frequency division on the received input data clock, to obtain a first intermediate clock. A frequency of the input data clock is higher than a frequency of the first intermediate clock, and the frequency of the first intermediate clock is equal to an operating frequency of the retimer 300. The frequency divider 332 may implement integer-multiple frequency division, for example, perform frequency division on a 200 MHz input data clock to obtain a 100 MHz first intermediate clock; or may implement fractional frequency division, for example, perform frequency division on a 130 MHz input data clock to obtain a 100 MHz first intermediate clock. The jitter filtering phase-locked loop 334 is configured to perform jitter filtering on the first intermediate clock, and perform frequency multiplication on a jitter-filtered first intermediate clock, to obtain a second intermediate clock whose frequency is equal to that of the input data clock. In an implementation, the jitter filtering phase-locked loop 334 is configured to perform high-frequency jitter filtering on the first intermediate clock. The jitter filtering phase-locked loop 334 may be a high-frequency jitter filtering phase-locked loop. Bandwidth of the jitter filtering phase-locked loop 334 may be determined based on the input data clock. The phase interpolator 336 is configured to: receive the second intermediate clock and the input data clock; adjust a phase of the second intermediate clock, such that the phase of the second intermediate clock is aligned with the phase of the input data clock, that is, a phase difference between the second intermediate clock and the input data clock is a preset first phase difference; and output an adjusted second intermediate clock as the output data clock to the synchronization circuit 340. For example, when the phase of the second intermediate clock is 20°, the phase of the input data clock is 80°, and the preset first phase difference is −30°, the phase of the input data clock remains unchanged, and the phase of the second intermediate clock is adjusted from 20° to 50°. It should be noted that all clock frequencies in this application are frequencies at which the jitter filtering phase-locked loop 334 is in a stable state when working normally.

A data transmission rate is relatively high on a high-speed serial link, and the frequency of the input data clock recovered on the high-speed serial link is also relatively high. Therefore, in the jitter filtering circuit 330, frequency division processing is first performed on the input data clock to reduce the frequency of the input data clock to the operating frequency of the retimer 300, and then jitter filtering is performed on the input data clock. This reduces an operating frequency of the jitter filtering phase-locked loop 334.

In an implementation, the jitter filtering circuit 330 may determine, based on an actual clock frequency, whether to use the frequency divider 332. When the frequency of the input data clock is relatively low, the input data clock may directly be used as an input of the jitter filtering phase-locked loop 334. The jitter filtering phase-locked loop 334 may perform frequency multiplication on the input data clock, or may directly perform jitter filtering on the input data clock.

A clock is usually rectangular pulses with a same pulse width, and frequency spectrum components of the clock include high-order harmonic waves. The clock and these high-order harmonic waves jointly cause electromagnetic interference in a circuit or between different circuits. To reduce the electromagnetic interference, a clock spread spectrum method may be used. To be more specific, frequency modulation is performed on the clock within a specific frequency range using a preset modulation waveform (for example, with a relatively low frequency), to reduce peak energy of a fundamental frequency and a harmonic wave that are included in the clock. For example, on the high-speed serial link, the input data clock may be a clock carrying Spread Spectrum Clock (SSC) information. In frequency domain, the SSC information is represented as a frequency spectrum with sideband harmonic waves that is produced based on a clock. When performing high-frequency jitter filtering on the first intermediate clock, the jitter filtering phase-locked loop 334 may retain a complete low-frequency jitter, such that some clock information included in the first intermediate clock or some clock information included in the input data clock, for example, SSC information, can be retained. In addition, the jitter filtering phase-locked loop 334 filters out high-frequency jitters on a link, the clock recovery circuit 312, and the like. Therefore, after a Separate Reference Clock with Independent Spread (SRIS) function is enabled on the high-speed serial link, both the input data clock and the output data clock in the retimer 300 can retain SSC information in a clock, and filter out high-frequency jitters.

Figure 5:
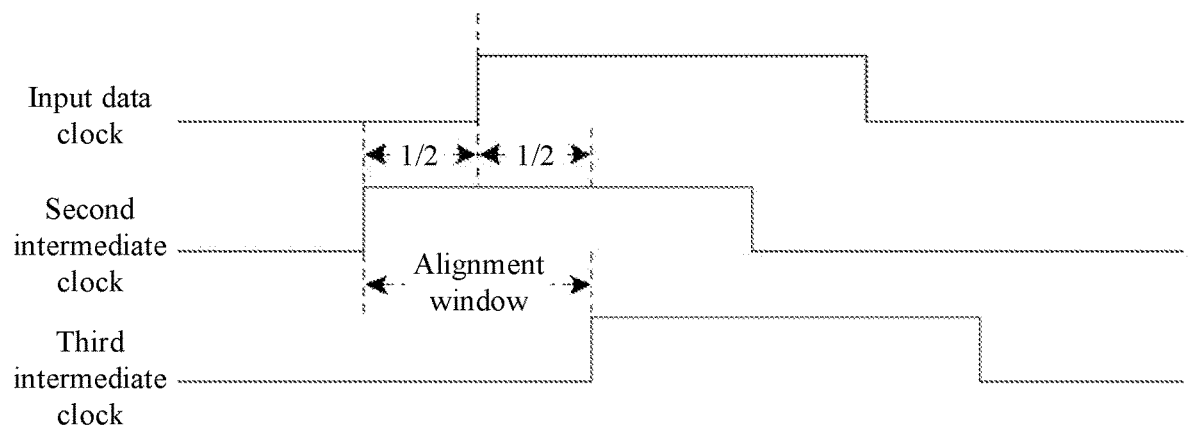
FIG. 5 is a sequence diagram of a phase interpolator according to an embodiment of this application.

A sequence diagram shown in FIG. 5 is used to describe functions of the phase interpolator 336. First, the phase interpolator 336 is configured to receive the second intermediate clock, and generate a third intermediate clock based on a preset second phase difference using the phase of the second intermediate clock as a reference. The second phase difference between the second intermediate clock and the third intermediate clock is a preset fixed value, and the second phase difference is an alignment window in the figure. Second, the phase interpolator 336 performs phase detection on the second intermediate clock, the third intermediate clock, and the input data clock, and determines a phase relationship among the three clocks. Finally, the phase interpolator 336 adjusts phases of both the second intermediate clock and the third intermediate clock, such that a rising edge of the input data clock is in the middle of the alignment window. In other words, the phase difference between the second intermediate clock and the input data clock is ½ times the alignment window, and a phase difference between the input data clock and the third intermediate clock is also ½ times the alignment window.

For example, the phases of the input data clock and the second intermediate clock that are received by the phase interpolator 336 are 30° and 0° respectively. The third intermediate clock is generated using the alignment window of 40°, that is, the phase of the third intermediate clock is 40°. After phase detection is performed, an ascending order of the phases of the clocks: the phase of the second intermediate clock, the phase of the input data clock, and the phase of the third intermediate clock. Finally, the phases of the second intermediate clock and the third intermediate clock are adjusted, such that the phase of the second intermediate clock becomes 10°, and the phase of the third intermediate clock becomes 50°.

Figure 6:
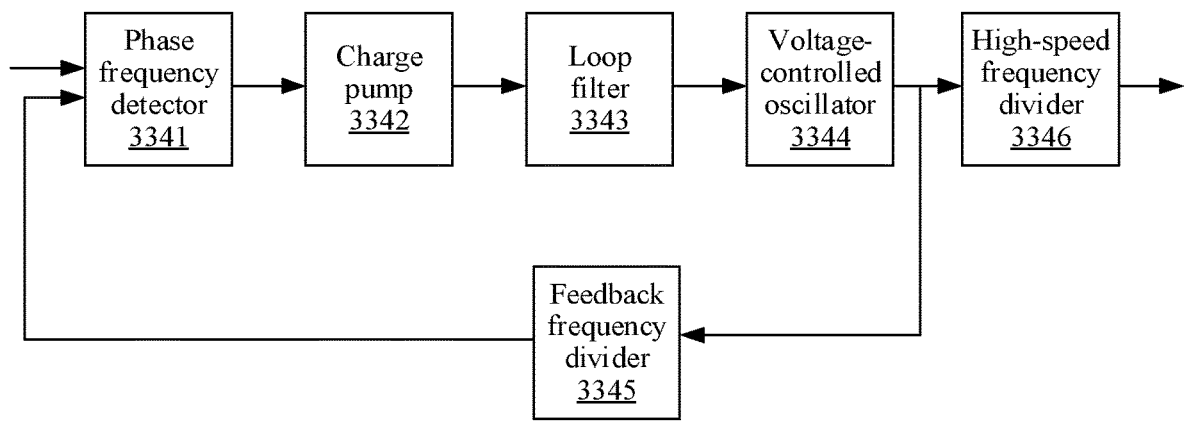
FIG. 6 shows a jitter filtering phase-locked loop according to an embodiment of this application.

FIG. 6 shows an implementation of the jitter filtering phase-locked loop 334. The jitter filtering phase-locked loop 334 includes a phase frequency detector (PFD) 3341, a charge pump 3342, a loop filter 3343, a voltage-controlled oscillator (VCO) 3344, a feedback frequency divider 3345, and a high-speed frequency divider 3346. The phase frequency detector 3341 in the jitter filtering phase-locked loop 334 receives the first intermediate clock generated by the frequency divider 332 and a feedback clock generated by the feedback frequency divider 3345, performs frequency and phase detection on the first intermediate clock and the feedback clock, and outputs a comparison result to the charge pump 3342. In an implementation, the comparison result may be a pulse with a variable width, where the width of the pulse is determined using a phase difference between the first intermediate clock and the feedback clock. For example, the width of the pulse is directly proportional to the phase difference. In an optional implementation, the charge pump 3342 is configured to convert the comparison result into a stable analog conversion voltage, and output the analog conversion voltage to the loop filter 3343. The loop filter 3343 is configured to perform low-pass filtering on the analog conversion voltage, for example, may filter out a jitter in the analog conversion voltage, and output an analog conversion voltage obtained after the low-pass filtering to the voltage-controlled oscillator 3344. In an implementation, the loop filter 3343 is configured to filter out a high-frequency jitter in the analog conversion voltage, and retain a low-frequency jitter in the analog conversion voltage, to support a specific transmission protocol or make the output data clock carry specific SSC information. The voltage-controlled oscillator 3344 is configured to generate a fourth intermediate clock based on the analog conversion voltage obtained after the low-pass filtering, and output the fourth intermediate clock to the high-speed frequency divider 3346, where a frequency of the fourth intermediate clock is higher than the frequency of the first intermediate clock. The high-speed frequency divider 3346 is configured to perform frequency division on the fourth intermediate clock, such that a frequency of the second intermediate clock generated by the high-speed frequency divider 3346 is equal to the frequency of the input data clock. The feedback frequency divider 3345 is configured to perform frequency division on the fourth intermediate clock generated by the voltage-controlled oscillator 3344, and output a frequency-divided fourth intermediate clock as the feedback clock to the phase frequency detector 3341, where a frequency of the feedback clock is equal to the frequency of the first intermediate clock. It should be noted that all clock frequencies in this application are frequencies at which the jitter filtering phase-locked loop 334 is in a stable state when working normally.

A frequency division ratio of the high-speed frequency divider 3346 is lower than that of the feedback frequency divider 3345. For example, the frequency of the first intermediate clock is 100 MHz, and the frequency of the fourth intermediate clock obtained after the phase frequency detector 3341, the charge pump 3342, the loop filter 3343, and the voltage-controlled oscillator 3344 perform related processing is 1600 MHz. The high-speed frequency divider 3346 performs frequency division on the fourth intermediate clock to obtain the second intermediate clock whose frequency is 400 MHz, while the feedback frequency divider 3345 performs frequency division on the fourth intermediate clock to obtain the feedback clock whose frequency is 100 MHz. In this way, the frequency of the feedback clock is the same as the frequency of the first intermediate clock.

Figure 7:
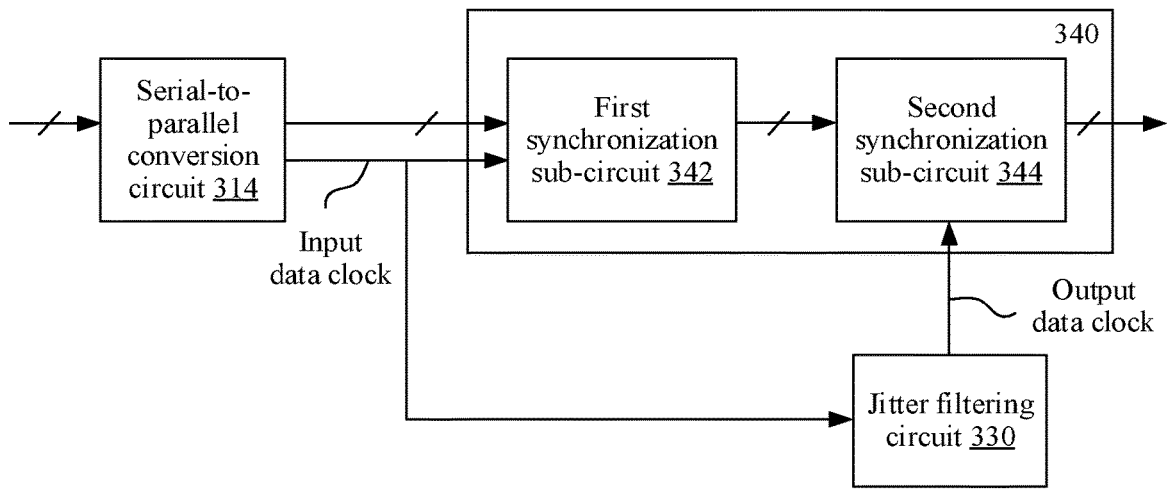
FIG. 7 shows a synchronization circuit according to an embodiment of this application.

FIG. 7 shows an implementation of the synchronization circuit 340. The synchronization circuit 340 includes a first synchronization sub-circuit 342 and a second synchronization sub-circuit 344. The first synchronization sub-circuit 342 is configured to synchronize the received input data for the first time based on the input data clock, to obtain first temporary data. The second synchronization sub-circuit 344 synchronizes the first temporary data for the second time based on the second intermediate clock (that is, the output data clock), to obtain the synchronization data. Synchronization processing is performed on the input data twice respectively based on the two clocks, such that the synchronization data can be transmitted at the frequency of the output data clock, and occurrence of a metastable state can be prevented. This prevents the retimer 300 from being affected by metastable-state propagation.

In an implementation, both the first synchronization sub-circuit 342 and the second synchronization sub-circuit 344 in the synchronization circuit 340 are registers, a working clock of the first synchronization sub-circuit 342 is the input data clock, and a working clock of the second synchronization sub-circuit is the second intermediate clock (that is, the output data clock). The register may include a plurality of parallel D flip-flops. Using the two clocks, it can be ensured that the second synchronization sub-circuit 344 can correctly sample data.

It should be noted that any one or a combination of circuits (e.g., the jitter filtering circuit 330, the synchronization circuit 340, and the clock recovery circuit 312) that are included in the retimer 300 in this application may alternatively be used to implement another cross-clock-domain processing circuit or scenario. The retimer 300 in this application is merely used an example of a scenario. In addition, the input data and the synchronization data in this embodiment of this application may be parallel data or serial data. For example, this embodiment of this application further provides a cross-clock-domain processing circuit, including the jitter filtering circuit 330, the synchronization circuit 340, and the clock recovery circuit 312. Both input data received by the cross-clock-domain processing circuit and synchronization data generated by the cross-clock-domain processing circuit may be parallel data or serial data.

Figure 8:
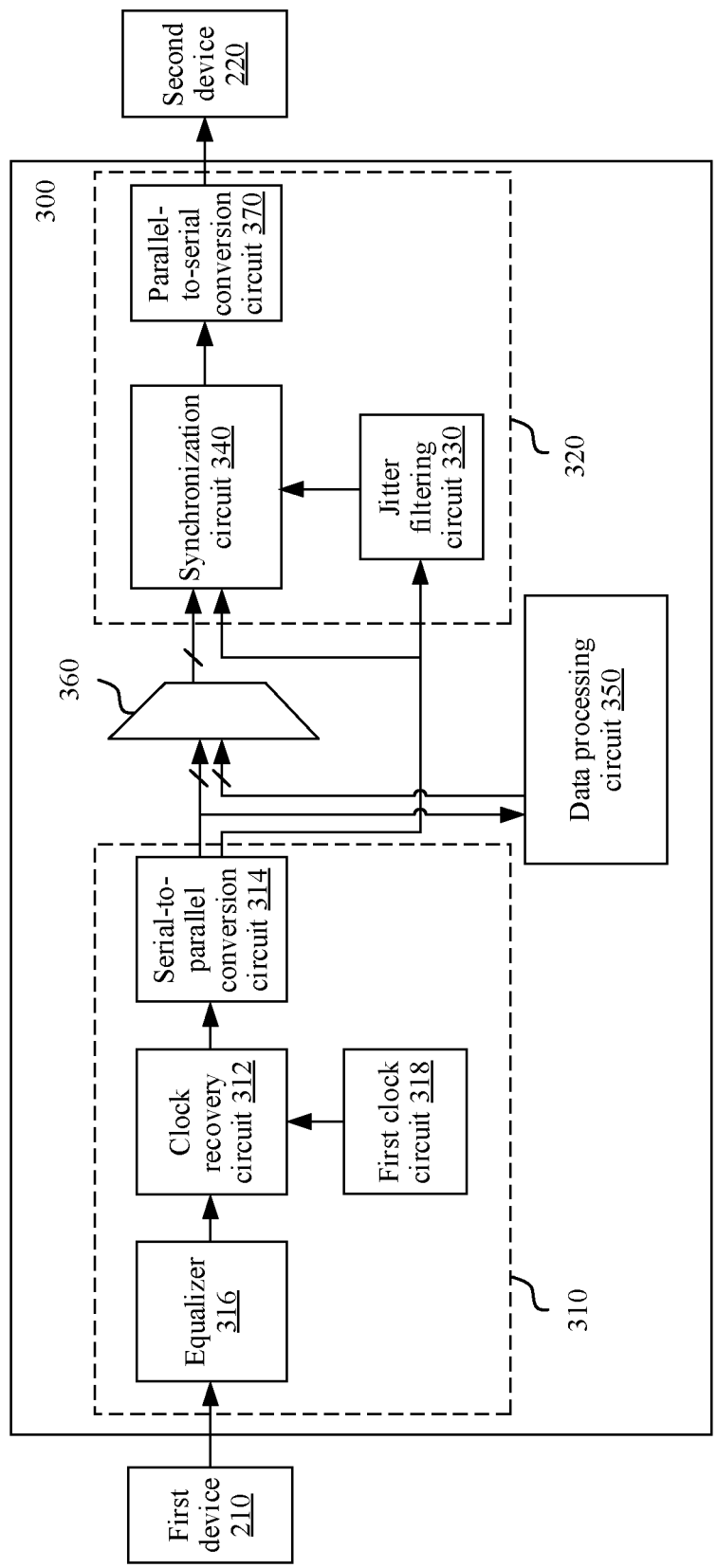
FIG. 8 shows a retimer according to an embodiment of this application.

FIG. 8 shows an implementation of the retimer 300. The retimer 300 in FIG. 8 further includes an equalizer 316, a first clock circuit 318, a data processing circuit 350, and a data selector 360. The equalizer 316 is configured to perform equalization processing on the serial data received by the receiving circuit 310, for example, perform Continuous Time Linear Equalization (CTLE), to improve performance of an eye diagram of the data receiving circuit 310 on a high-speed serial link with a relatively large transmission loss; and output serial data obtained after the equalization processing to the clock recovery circuit 312. The first clock circuit 318 is configured to provide a working clock for the clock recovery circuit 312 based on the reference clock of the retimer 300. In an implementation, the first device 210 and the retimer 300 share one reference clock, and a reference clock of the second device 220 is independent of the shared reference clock. In an implementation, the second device 220 and the retimer 300 share one reference clock, and a reference clock of the first device 210 is independent of the shared reference clock. In another implementation, the first device 210, the second device 220, and the retimer 300 each use an independent reference clock.

Figure 9:
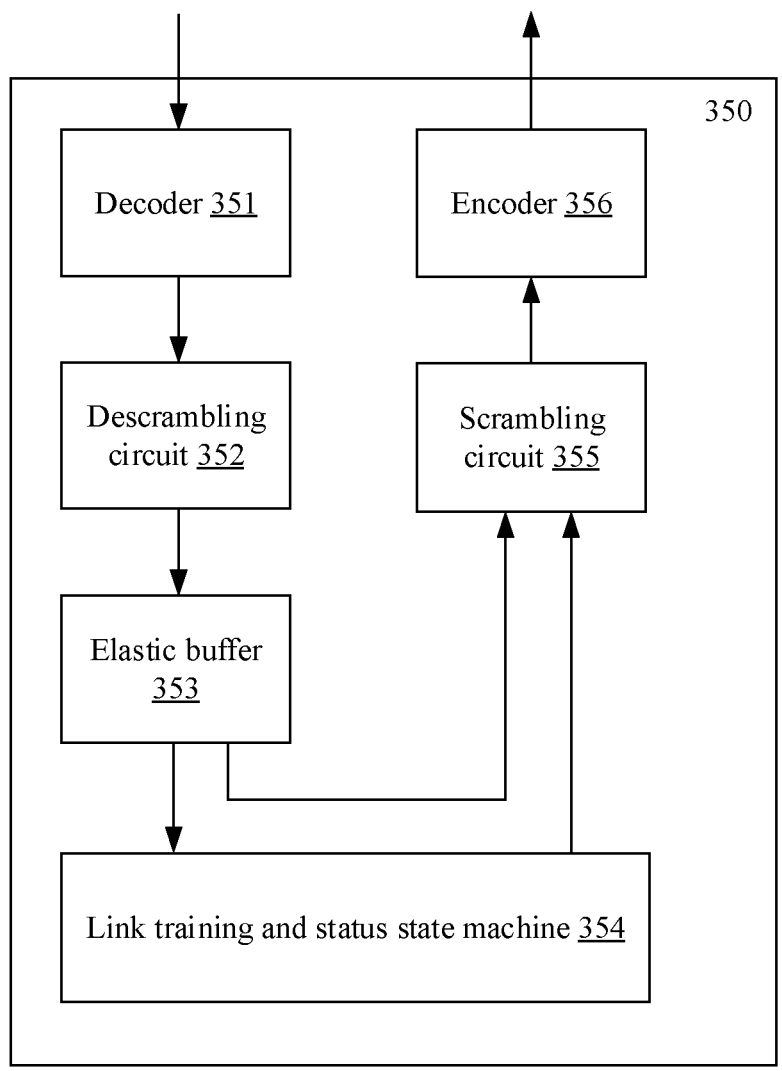
FIG. 9 shows a data processing circuit according to an embodiment of this application.

The data processing circuit 350 is configured to perform processing such as encoding, decoding, scrambling, descrambling, buffering, and synchronization on data. The data processing circuit 350 may selectively perform processing such as decoding, descrambling, synchronization, scrambling, and encoding on received data, and a sequence of the plurality of processing processes is variable. For example, decoding, descrambling, synchronization, scrambling, and encoding processing may be sequentially performed on the received data, or decoding, synchronization, and encoding processing may be sequentially performed on the received data, or descrambling, synchronization, and scrambling processing may be sequentially performed on the received data. FIG. 9 shows an implementation of the data processing circuit 350. In an embodiment, the data processing circuit 350 includes a decoder 351, a descrambling circuit 352, an elastic buffer 353, a Link Training and Status State Machine (LTSSM) 354, a scrambling circuit 355, and an encoder 356. The decoder 351 is configured to perform alignment decoding on the received data, for example, search for a characteristic code in the received data, and remove a synchronization header from the data based on the characteristic code. The descrambling circuit 352 is configured to perform descrambling processing on data output by the decoder 351. The elastic buffer 353 is configured to buffer data output by the descrambling circuit 352, and output the buffered data to the link training and status state machine 354. The elastic buffer 353 is a buffer with a variable data buffer size, and the data buffer size of the elastic buffer 353 is determined based on the reference clock of the retimer 300. The link training and status state machine 354 is configured to receive the data output by the elastic buffer 353, and train a link. For example, before a link using a PCIe interface works normally, the link training and status state machine 354 needs to train the link, to initialize the link and configure link information. When link training is completed and the link works normally, the data generated by the elastic buffer 353 may directly be output to the scrambling circuit 355 without passing through the link training and status state machine 354. The scrambling circuit 355 is configured to perform scrambling processing on the data output by the link training and status state machine 354. Scrambling processing may be performed in a manner corresponding to a descrambling manner. A decoder 356 is configured to encode scrambled data, and output encoded data.

The data selector 360 is configured to: receive both the data generated by the clock recovery circuit 312 and the data generated by the data processing circuit 350, select one of the two channels of data, and output the selected channel of data to the synchronization circuit 340. In an implementation, a control signal may be used to control the data selector 360 to output the data generated by the clock recovery circuit 312 or to output the data generated by the data processing circuit 350, where the control signal may be configured by a register. Because the data selector 360 has a function of selecting either of the two channels of data, the parallel data may be transmitted from the data receiving circuit 310 to the data transmitting circuit 320 through two channels. 1. The parallel data is first output from the clock recovery circuit 312 to the data processing circuit 350, and then is input to the data transmitting circuit 320 from the data processing circuit 350 after passing through the data selector 360. In a specific transmission protocol, the data processing circuit 350 performs processing such as encoding, decoding, scrambling, and descrambling on the parallel data. 2. The parallel data is directly output from the clock recovery circuit 312, passes through the data selector 360, and is input to the data transmitting circuit 320, without undergoing any data processing. Such a bitstream forwarding (BSF) mode can minimize a latency caused when data passes through the retimer 300. By adjusting the control signal used for the data selector 360, the retimer 300 may be controlled to switch between the two modes.

Figure 10:
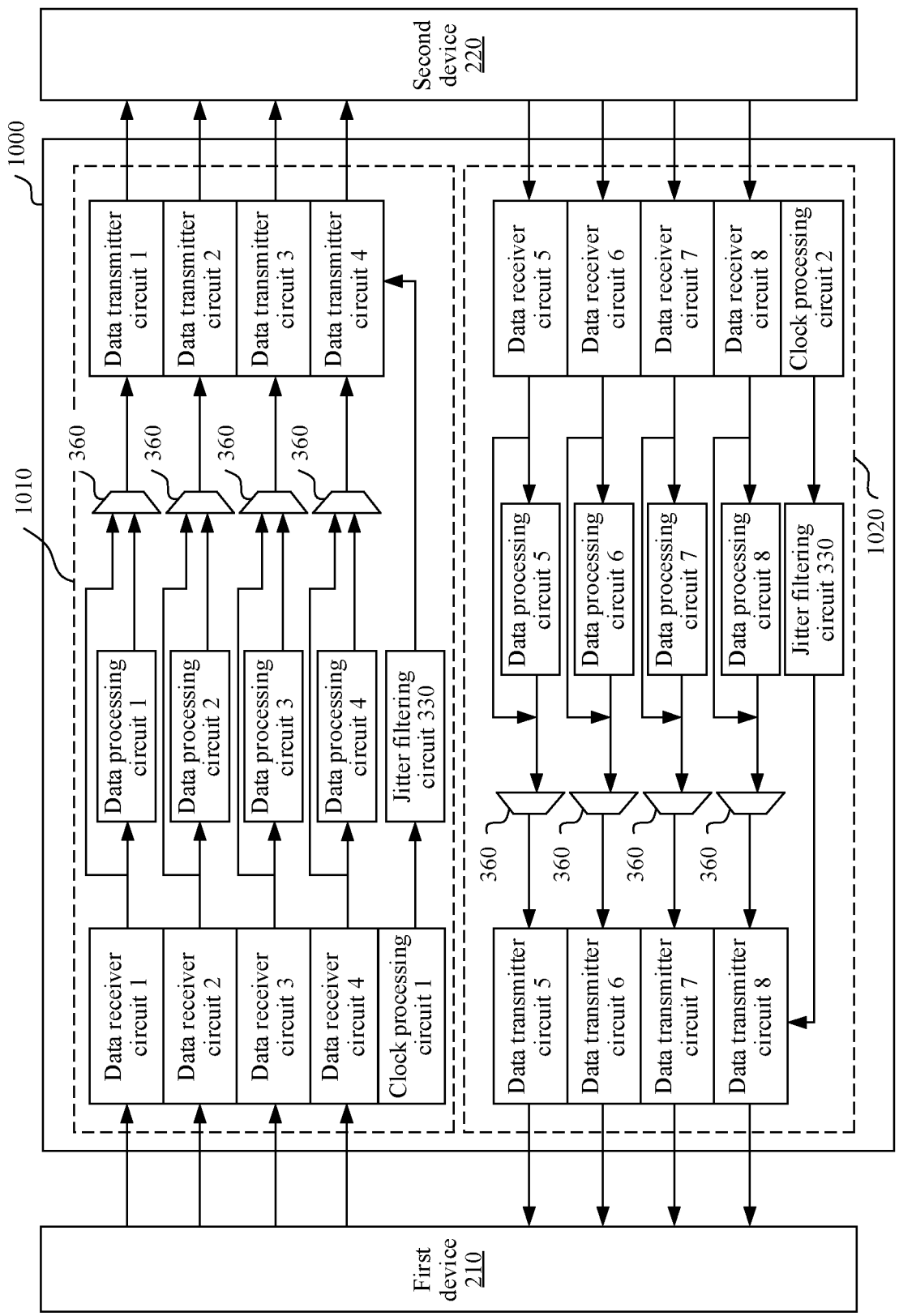
FIG. 10 shows a multi-channel retimer according to an embodiment of this application.

FIG. 10 shows a multi-channel retimer 1000 according to an embodiment of this application. The retimer 1000 includes an uplink retiming circuit 1010 and a downlink retiming circuit 1020. The uplink retiming circuit 1010 is configured to perform relaying and jitter filtering on a multi-bit serial signal on an uplink high-speed serial transmission link that is from the first device 210 to the second device 220. The downlink retiming circuit 1020 is configured to perform relaying and jitter filtering on a multi-bit serial signal on a downlink high-speed serial transmission link that is from the second device 220 to the first device 210. It should be noted that concepts of the uplink and downlink are relative to each other. Four uplink channels and four downlink channels are used as an example to describe a circuit structure of the retimer 1000, but quantities of uplink channels and downlink channels in the retimer 1000 are not limited in this application. In an embodiment, the uplink retiming circuit 1010 includes four uplink channels. Each uplink channel includes one data receiving circuit, one data processing circuit, one data selector, and one data transmitting circuit, and a direction of a data stream of the uplink channel is from the first device 210 to the second device 220. The downlink retiming circuit 1020 includes four downlink channels. Each downlink channel includes one data receiving circuit, one data processing circuit, one data selector 360, and one data transmitting circuit, and a direction of a data stream of the downlink channel of the downlink retiming circuit 1020 is opposite to that of the uplink retiming circuit 1010, that is, from the second device 220 to the first device 210. Similar to the retimer 300, for each uplink channel or downlink channel, serial data is converted into parallel data using a data receiving circuit n, and the data is processed using a data processing circuit n and then processed data is output to a data selector 360, or the data is directly output to a data selector 360 without being processed by a data processing circuit n. Finally, cross-clock-domain synchronization is performed on the output data using a data transmitting circuit n, and synchronized parallel data is converted into serial data. For the retimer 1000, n may be 1, 2, . . . , or 8.

A data receiving circuit 1, a data receiving circuit 2, a data receiving circuit 3, a data receiving circuit 4, a data receiving circuit 5, a data receiving circuit 6, a data receiving circuit 7, and a data receiving circuit 8 in the retimer 1000 shown in FIG. 10 each may include some or all circuits in the data receiving circuit 310 provided in the embodiments of this application, and these receiving circuits share some circuits in the data receiving circuit 310. A data transmitting circuit 1, a data transmitting circuit 2, a data transmitting circuit 3, a data transmitting circuit 4, a data transmitting circuit 5, a data transmitting circuit 6, a data transmitting circuit 7, and a data transmitting circuit 8 in the retimer 1000 each may include some or all circuits in the data transmitting circuit 320 provided in the embodiments of this application, and these transmitting circuits share some circuits in the data transmitting circuit 320.

In an implementation, four data receiving circuits in the uplink retiming circuit 1010 may share one clock processing circuit 1, and four data receiving circuits in the downlink retiming circuit 1020 may share one clock processing circuit 2. Both the clock processing circuit 1 and the clock processing circuit 2 may be first clock circuits 318 in this embodiment of this application. The clock processing circuit 1 respectively recovers four channels of clocks from four channels of parallel data in the uplink retiming circuit 1010 clock, selects one of the four channels of clocks as an input clock, and outputs the input clock to the synchronization circuit. The processing process is the same as the downlink retiming circuit 1020.

In an implementation, four data transmitting circuits in the uplink retiming circuit 1010 may share one jitter filtering circuit 330, and four data receiver circuits in the downlink retiming circuit 1020 may also share one jitter filtering circuit 330. Each data transmitting circuit in the uplink retiming circuit 1010 includes one synchronization circuit 340, and each data transmitting circuit in the downlink retiming circuit 1010 also includes one synchronization circuit 340, to synchronize input data that needs to be synchronized in the data transmitting circuit. In addition, all of a data processing circuit 1, a data processing circuit 2, a data processing circuit 3, a data processing circuit 4, a data processing circuit 5, a data processing circuit 6, a data processing circuit 7, and a data processing circuit 8 in the retimer 1000 may be data processing circuits 320 provided in the embodiments of this application.

In the multi-channel retimer 1000, a plurality of channels share one clock processing circuit, one synchronization circuit 340, and one jitter filtering circuit 330, such that the retimer 1000 further reduces required buffer resources while ensuring a low latency, thereby reducing a hardware area of the retimer 1000 and reducing power consumption. This improves performance of the retimer 1000.

A structure of the multi-channel retimer 1000 is described using an example. The retimer is configured to relay N channels of input data on a transmission link, and includes a jitter filtering circuit and N synchronization circuits, where N≥1, and N is a positive integer. In an embodiment, the jitter filtering circuit is configured to receive an input data clock, perform jitter filtering and phase adjustment on the input data clock, and output a processed input data clock as an output data clock to the N synchronization circuits. A phase of the output data clock is aligned with a phase of the input data clock. The input data clock is any one of N recovered data clocks recovered based on the N channels of input data. Each of the N synchronization circuits is configured to perform cross-clock-domain synchronization on each of the N channels of input data based on the input data clock and the output data clock, to generate N channels of synchronization data. The N channels of synchronization data are in a clock domain of the output data clock.

The jitter filtering circuit includes a frequency divider, a jitter filtering phase-locked loop, and a phase interpolator. The frequency divider, the jitter filtering phase-locked loop, and the phase interpolator may be the frequency divider, the jitter filtering phase-locked loop, and the phase interpolator that are provided in the embodiments of this application, respectively.

Each of the N synchronization circuits includes a first synchronization sub-circuit and a second synchronization sub-circuit. The first synchronization sub-circuit is configured to synchronize one of the N channels of input data based on the input data clock, to obtain first temporary data. The second synchronization sub-circuit is configured to synchronize the first temporary data based on a second intermediate clock, to obtain one of the N channels of synchronization data. The first synchronization sub-circuit and the second synchronization sub-circuit may be the synchronization sub-circuits provided in the embodiments of this application.

The retimer further includes N clock recovery circuits. The N clock recovery circuits are configured to: respectively receive the N channels of input data; recover a clock in the N channels of input data based on a reference clock of the retimer to respectively obtain the N recovered data clocks; and output the N channels of input data and the N recovered data clocks.

In an implementation, the N channels of input data are N channels of serial data, and the retimer further includes N serial-to-parallel conversion circuits. The N serial-to-parallel conversion circuits are configured to respectively perform serial-to-parallel conversion on the N channels of input data, and respectively output converted N channels of input data to the N synchronization circuits and the jitter filtering circuit.

In an implementation, the N channels of synchronization data are N channels of parallel data, and the retimer further includes N parallel-to-serial conversion circuits. The N parallel-to-serial conversion circuits are configured to respectively convert the N channels of synchronization data into N channels of serial output data, and output converted N channels of serial output data.

The retimer further includes N data processing circuits and N data selectors. Input ends of the N data processing circuits are respectively coupled to output ends of the N clock recovery circuits, output ends of the N data processing circuits are respectively coupled to input ends of the N data selectors, and the N data processing circuits are configured to decode, descramble, synchronize, scramble, and encode the received N channels of input data respectively. For one data processing circuit, one clock recovery circuit, and one data selector that are coupled to each other, two input ends of the data selector are respectively coupled to an output end of the clock recovery circuit and an output end of the data processing circuit, and an output end of the data selector is coupled to an output end of the synchronization circuit.

In an implementation, the jitter filtering circuit is further configured to perform high-frequency jitter filtering on N input data clocks, where both the input data clock and the output data clock include SSC information.

In an implementation, the retimer is a multi-channel retimer, where N≥2, and N is a positive integer.

An embodiment of this application further provides a retimer chip, configured to relay a data signal on a high-speed serial transmission link and filter out a jitter. The retimer chip may be an Application Specific Integrated Circuit (ASIC), a Field-Programmable Gate Array (FPGA), or another type of integrated circuit. The retimer chip includes any retimer provided in this application, and a circuit in the retimer is integrated on a wafer (die).

An embodiment of this application further provides a retimer apparatus, including one or more of the foregoing retimer chips. In an implementation, the one or more retimer chips are independently packaged, and are disposed on one PCB. In an implementation, alternatively, the one or more retimer chips may be independently packaged and may be separately disposed on a plurality of PCBs, and perform communication through a connector or a data connection wire between the PCBs. In another implementation, alternatively, the plurality of retimer chips may be packaged in one package structure and may be disposed on one PCB.

The foregoing descriptions are merely example implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A cross-clock-domain processing circuit, comprising:
   a jitter filtering circuit configured to:
      receive an input data clock having an input phase;
      perform jitter filtering processing and phase adjustment processing on the input data clock to generate an output data clock having an output phase aligned with the input phase; and
      output the output data clock, and wherein the input data clock is recovered from the input data; and
   a synchronization circuit configured to:
      receive the output data clock from the jitter filtering circuit; and
      generate synchronization data by performing cross-clock-domain synchronization on the input data based on the input data clock and the output data clock,
      wherein the synchronization data is in a clock domain of the output data clock.

2. The cross-clock-domain processing circuit of claim 1, further comprising:
   a frequency divider configured to perform frequency division on the input data clock to obtain a first intermediate clock, wherein an input frequency of the input data clock is greater than a first frequency of the first intermediate clock;
   a jitter filtering phase-locked loop configured to:
      perform jitter filtering on the first intermediate clock; and
      perform frequency multiplication on a jitter-filtered first intermediate clock to obtain a second intermediate clock, wherein a second frequency of the second intermediate clock is equal to the input frequency of the input data clock; and
   a phase interpolator configured to:
      receive the second intermediate clock and the input data clock; and
      adjust a second phase of the second intermediate clock such that the second phase is aligned with the input phase of the input data clock, wherein an adjusted second intermediate clock is the output data clock.

3. The cross-clock-domain processing circuit of claim 2, wherein the phase interpolator is further configured to:
   generate a third intermediate clock based on the second intermediate clock, wherein a first phase difference between the second intermediate clock and the third intermediate clock is a preset phase difference;
   perform phase detection on the second intermediate clock, the third intermediate clock, and the input data clock;
   determine a phase relationship among the second intermediate clock, the third intermediate clock, and the input data clock; and
   adjust phases of the second intermediate clock and the third intermediate clock, such that a second phase difference between the input data clock and the second intermediate clock is equal to a third phase difference between the third intermediate clock and the input data clock.

4. The cross-clock-domain processing circuit of claim 2, wherein the synchronization circuit comprises:
   a first synchronization sub-circuit configured to synchronize the input data based on the input data clock to obtain first temporary data; and
   a second synchronization sub-circuit configured to synchronize the first temporary data based on the second intermediate clock to obtain the synchronization data.

5. The cross-clock-domain processing circuit of claim 4, wherein the first synchronization sub-circuit and the second synchronization sub-circuit are registers, wherein a first working clock of the first synchronization sub-circuit is the input data clock, and wherein a second working clock of the second synchronization sub-circuit is the second intermediate clock.

6. The cross-clock-domain processing circuit of claim 2, wherein the jitter filtering phase-locked loop comprises:
   a phase frequency detector configured to:
      receive the first intermediate clock and a feedback clock;
      perform frequency and phase detection on the first intermediate clock and the feedback clock; and
      output a comparison result of the frequency and phase detection;
   a loop filter configured to filter out a jitter in the comparison result, and output a jitter-filtered comparison result;
   a voltage-controlled oscillator (VCO) configured to generate a fourth intermediate clock based on the jitter-filtered comparison result, wherein a fourth frequency of the fourth intermediate clock is higher than the first frequency of the first intermediate clock;
   a feedback frequency divider configured to:
      perform frequency division on the fourth intermediate clock; and
      output a frequency-divided fourth intermediate clock as the feedback clock to the phase frequency detector, wherein a feedback frequency of the feedback clock is equal to the first frequency of the first intermediate clock; and
   a high-speed frequency divider configured to:
      perform frequency division on the fourth intermediate clock; and
      use a second frequency-divided fourth intermediate clock as the second intermediate clock.

7. The cross-clock-domain processing circuit of claim 1, wherein the cross-clock-domain processing circuit further comprises a clock recovery circuit configured to:
   receive the input data;
   recover a clock in the input data from a reference clock of the cross-clock-domain processing circuit to obtain the input data clock; and
   output the input data and the input data clock.

8. The cross-clock-domain processing circuit of claim 1, wherein the input data is serial data, and wherein the cross-clock-domain processing circuit further comprises a serial-to-parallel conversion circuit configured to:
   perform serial-to-parallel conversion on the input data; and
   output converted input data to the synchronization circuit and the jitter filtering circuit.

9. The cross-clock-domain processing circuit of claim 1, wherein the jitter filtering circuit is further configured to perform high-frequency jitter filtering on the input data clock, and wherein both the input data clock and the output data clock comprise spread spectrum clock (SSC) information.

10. A retimer configured to relay N channels of input data on a transmission link, wherein the retimer comprises:
- a jitter filtering circuit configured to:
  - receive an input data clock having an input phase;
  - perform jitter filtering and phase adjustment on the input data clock to generate an output data clock having an output phase aligned with the input phase; and
  - output the output data clock, wherein the input data clock is any one of N recovered data clocks recovered by a clock recovery circuit from the N channels of input data, and wherein N≥1; and
- N synchronization circuits configured to receive the output data clock from the jitter filtering circuit, wherein each of the N synchronization circuits is configured to generate one of N channels of synchronization data by performing cross-clock-domain synchronization on each of the N channels of input data based on the input data clock and the output data clock, and wherein the N channels of synchronization data are in a clock domain of the output data clock.

11. The retimer of claim 10, wherein the jitter filtering circuit comprises:
- a frequency divider configured to perform frequency division on the input data clock to obtain a first intermediate clock, wherein an input frequency of the input data clock is greater than a first frequency of the first intermediate clock;
- a jitter filtering phase-locked loop configured to:
  - perform jitter filtering on the first intermediate clock; and
  - perform frequency multiplication on a jitter-filtered first intermediate clock to obtain a second intermediate clock, wherein a second frequency of the second intermediate clock is equal to the input frequency of the input data clock; and
- a phase interpolator configured to:
  - receive the second intermediate clock and the input data clock; and
  - adjust a second phase of the second intermediate clock such that the second phase is aligned with the input phase of the input data clock, wherein an adjusted second intermediate clock is the output data clock.

12. The retimer of claim 11, wherein the phase interpolator is further configured to:
- generate a third intermediate clock based on the second intermediate clock, wherein a first phase difference between the second intermediate clock and the third intermediate clock is a preset phase difference;
- perform phase detection on the second intermediate clock, the third intermediate clock, and the input data clock;
- determine a phase relationship among the second intermediate clock, the third intermediate clock, and the input data clock; and
- adjust phases of the second intermediate clock and the third intermediate clock, such that a second phase difference between the input data clock and the second intermediate clock is equal to a third phase difference between the third intermediate clock and the input data clock.

13. The retimer of claim 11, wherein each of the N synchronization circuits comprises:

- a first synchronization sub-circuit configured to synchronize one of the N channels of input data based on the input data clock to obtain first temporary data; and
- a second synchronization sub-circuit configured to synchronize the first temporary data based on the second intermediate clock to obtain one of the N channels of synchronization data.

14. The retimer of claim 13, wherein the first synchronization sub-circuit and the second synchronization sub-circuit are registers, wherein a first working clock of the first synchronization sub-circuit is the input data clock, and wherein a second working clock of the second synchronization sub-circuit is the second intermediate clock.

15. The retimer of claim 11, wherein the jitter filtering phase-locked loop comprises:
- a phase frequency detector configured to:
  - receive the first intermediate clock and a feedback clock;
  - perform frequency and phase detection on the first intermediate clock and the feedback clock; and
  - output a comparison result of the frequency and phase detection;
- a loop filter configured to:
  - filter out a jitter in the comparison result; and
  - output a jitter-filtered comparison result;
- a voltage-controlled oscillator configured to generate, based on the jitter-filtered comparison result, a fourth intermediate clock, wherein a fourth frequency of the fourth intermediate clock is higher than the first frequency of the first intermediate clock;
- a feedback frequency divider configured to:
  - perform frequency division on the fourth intermediate clock; and
  - output a frequency-divided fourth intermediate clock as the feedback clock to the phase frequency detector, wherein a feedback frequency of the feedback clock is equal to the first frequency of the first intermediate clock; and
- a high-speed frequency divider configured to:
  - perform frequency division on the fourth intermediate clock; and
  - use a second frequency-divided fourth intermediate clock as the second intermediate clock.

16. The retimer of claim 10, further comprising N clock recovery circuits configured to:
- respectively receive the N channels of input data;
- recover a clock in the N channels of input data from a reference clock of the retimer to respectively obtain the N recovered data clocks; and
- output the N channels of input data and the N recovered data clocks.

17. The retimer of claim 16, wherein the N channels of input data are N channels of serial data, and wherein the retimer further comprises N serial-to-parallel conversion circuits configured to:
- respectively perform serial-to-parallel conversion on the N channels of input data; and
- respectively output converted N channels of input data to the N synchronization circuits and the jitter filtering circuit.

18. The retimer of claim 17, wherein the N channels of synchronization data are N channels of parallel data, and wherein the retimer further comprises N parallel-to-serial conversion circuits configured to:
- respectively convert the N channels of synchronization data into N channels of serial output data; and
- output converted N channels of serial output data.

19. The retimer of claim 16, further comprising:

N data processing circuits, wherein first input ends of the N data processing circuits are respectively coupled to first output ends of the N clock recovery circuits, wherein second output ends of the N data processing circuits are respectively coupled to second input ends of N data selectors, and wherein the N data processing circuits are configured to decode, descramble, synchronize, scramble, and encode the N channels of input data respectively; and the N data selectors, wherein for one data processing circuit, one clock recovery circuit, and one data selector that are coupled to each other, wherein two input ends of the data selector are respectively coupled to a first output end of the clock recovery circuit and a second output end of the data processing circuit, and wherein a third output end of the data selector is coupled to a fourth output end of one of the N synchronization circuits.

20. A communication device, comprising:

a printed circuit board (PCB); and a cross-clock-domain processing circuit disposed on the PCB, wherein the cross-clock-domain processing circuit comprises:
  a jitter filtering circuit configured to:
    receive an input data clock having an input phase;
    perform jitter filtering processing and phase adjustment processing on the input data clock to generate an output data clock having an output phase aligned with the input phase; and
    output the output data clock, wherein the cross-clock-domain processing circuit is configured to perform cross-clock-domain processing on input data, and wherein the input data clock is recovered from the input data;
  a synchronization circuit configured to:
    receive the processed input data clock from the jitter filtering circuit; and
    perform cross-clock-domain synchronization on the input data based on the input data clock and the output data clock, to generate synchronization data, wherein the synchronization data is in a clock domain of the output data clock.

\* \* \* \* \*